(12) United States Patent
Kuan et al.

(10) Patent No.: US 9,455,243 B1
(45) Date of Patent: Sep. 27, 2016

(54) SILICON INTERPOSER AND FABRICATION METHOD THEREOF

(71) Applicant: INOTERA MEMORIES, INC., Taoyuan (TW)

(72) Inventors: Shih-Fan Kuan, Taoyuan (TW); Neng-Tai Shih, New Taipei (TW)

(73) Assignee: INOTERA MEMORIES, INC., Taoyuan (TW)

( * ) Notice: Subject to any disclaimer, the term of this patent is extended or adjusted under 35 U.S.C. 154(b) by 0 days.

(21) Appl. No.: 14/720,840

(22) Filed: May 25, 2015

(51) Int. Cl.
| | |
|---|---|
| H01L 23/48 | (2006.01) |
| H01L 23/52 | (2006.01) |
| H01L 29/40 | (2006.01) |
| H01L 25/16 | (2006.01) |
| H01L 23/498 | (2006.01) |
| H01L 23/31 | (2006.01) |

(52) U.S. Cl.
CPC ........... *H01L 25/16* (2013.01); *H01L 23/3128* (2013.01); *H01L 23/49811* (2013.01); *H01L 23/49827* (2013.01)

(58) Field of Classification Search
CPC ............... H01L 25/16; H01L 23/3128; H01L 23/49811; H01L 23/49827
See application file for complete search history.

(56) References Cited

U.S. PATENT DOCUMENTS

| | | | |
|---|---|---|---|
| 2011/0193491 A1* | 8/2011 | Choutov | H05B 33/0803 315/291 |
| 2013/0049216 A1 | 2/2013 | Lin | |
| 2014/0252632 A1 | 9/2014 | Barth | |

* cited by examiner

*Primary Examiner* — Thanh Y Tran
(74) *Attorney, Agent, or Firm* — Winston Hsu; Scott Margo

(57) ABSTRACT

A silicon interposer includes a silicon substrate having a front side and a rear side opposite to the front side; a first integrated circuit chip disposed in the front side of the silicon substrate; a second integrated circuit chip disposed in the front side of the silicon substrate and being in close proximity to the first integrated circuit chip; a dummy kerf region between the first integrated circuit chip and the second integrated circuit chip; and at least a circuit device disposed in the front side of the silicon substrate within the kerf region.

9 Claims, 7 Drawing Sheets

SILICON INTERPOSER AND FABRICATION METHOD THEREOF

BACKGROUND OF THE INVENTION

1. Field of the Invention

The present invention relates generally to a semiconductor device. More particularly, it pertains to a silicon interposer with circuit devices fabricated on the scribe line or kerf between chips.

2. Description of the Prior Art

As known in the art, integrated circuits (IC's) are typically assembled into a package that is mounted to a printed circuit board or a motherboard of a computer system. The IC may be mounted to a substrate or an interposer, and then encapsulated with a plastic or epoxy material.

A process known to those skilled in the art as flip-chip technology may be used to attach an IC to a substrate with the IC's I/O (input/output) side (or active side) facing down toward the mounting surface of the substrate or interposer.

Typically, the interposer "fans-out" the relatively small die pad pitch of the integrated circuit to the larger contact pad pitch of the printed circuit board. It would be desirable to utilize the interposer for functions other than fanning out the signals of the integrated circuit.

SUMMARY OF THE INVENTION

According to one aspect of the invention, a silicon interposer includes a silicon substrate having a front side and a rear side opposite to the front side; a first integrated circuit chip disposed in the front side of the silicon substrate; a second integrated circuit chip disposed in the front side of the silicon substrate and being in close proximity to the first integrated circuit chip; a dummy kerf region between the first integrated circuit chip and the second integrated circuit chip; and at least a circuit device disposed in the front side of the silicon substrate within the kerf region.

According to one embodiment of the invention, a redistribution layer (RDL) is disposed on the front side. The RDL covers the first integrated circuit chip, the second integrated circuit chip, and the dummy kerf region. Through-substrate vias (TSVs) are formed in the silicon substrate to electrically connect the RDL.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

DETAILED DESCRIPTION

Figure 1:
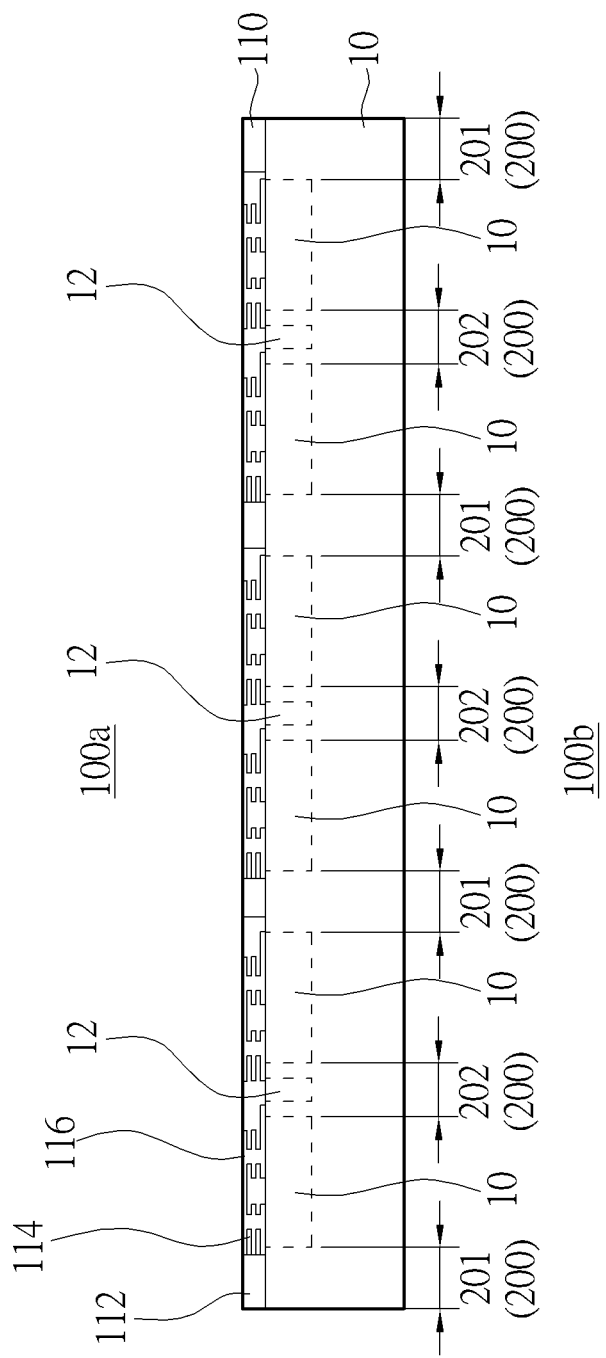
FIGS. 1-6 are schematic, cross-sectional diagrams showing an exemplary method for fabricating a silicon interposer and semiconductor chip package with through substrate vias (TSVs) according to one embodiment of the invention.

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present invention.

The following detailed description is, therefore, not to be taken in a limiting sense, and the scope of the present invention is defined only by the appended claims, along with the full scope of equivalents to which such claims are entitled.

One or more implementations of the present invention will now be described with reference to the attached drawings, wherein like reference numerals are used to refer to like elements throughout, and wherein the illustrated structures are not necessarily drawn to scale.

The terms "die", "semiconductor chip", and "semiconductor die" are used interchangeable throughout the specification. The terms wafer and substrate used herein include any structure having an exposed surface onto which a layer is deposited according to the present invention, for example, to form the integrated circuit (IC) structure. The term substrate is understood to include semiconductor wafers.

The term wafer and substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

Please refer to FIG. 1 to FIG. 6. FIGS. 1-6 are schematic, cross-sectional diagrams showing an exemplary method for fabricating a silicon interposer and semiconductor chip package with through substrate vias (TSVs) according to one embodiment of the invention.

First, as shown in FIG. 1, a wafer (interposer wafer) 100 is provided. For example, the wafer 100 is a semiconductor wafer or a silicon wafer. The wafer 100 has a front side 100*a* and a rear side 100*b* that is opposite to the front side 100*a*. According to the illustrated embodiment, a plurality of chips (or dies) 10 are fabricated on the front side 100*a* of the wafer 100.

According to the illustrated embodiment, in each chip 10, integrated circuits including, but not limited to, memory arrays, peripheral circuits, logic circuits, etc. are located. According to the illustrated embodiment, the chip 10 may be a memory chip, but not limited thereto.

The details of the fabrication steps for forming the integrated circuits in each chip 10 are omitted for the sake of simplicity. In general, the fabrication steps for forming the integrated circuits in each chip 10 involve conventional semiconductor processing technologies such as, for example, lithographic processes, etching processes, doping processes, thermal processes, polishing processes, film depositing processes, or the like.

According to the illustrated embodiment, kerfs 200 (or scribe lines) are provided between the chips 10. The chips 10 are separated from one another by the kerf 200. According to the illustrated embodiment, the kerf 200 comprises a first kerf region 201 and a second kerf region 202.

Figure 7:
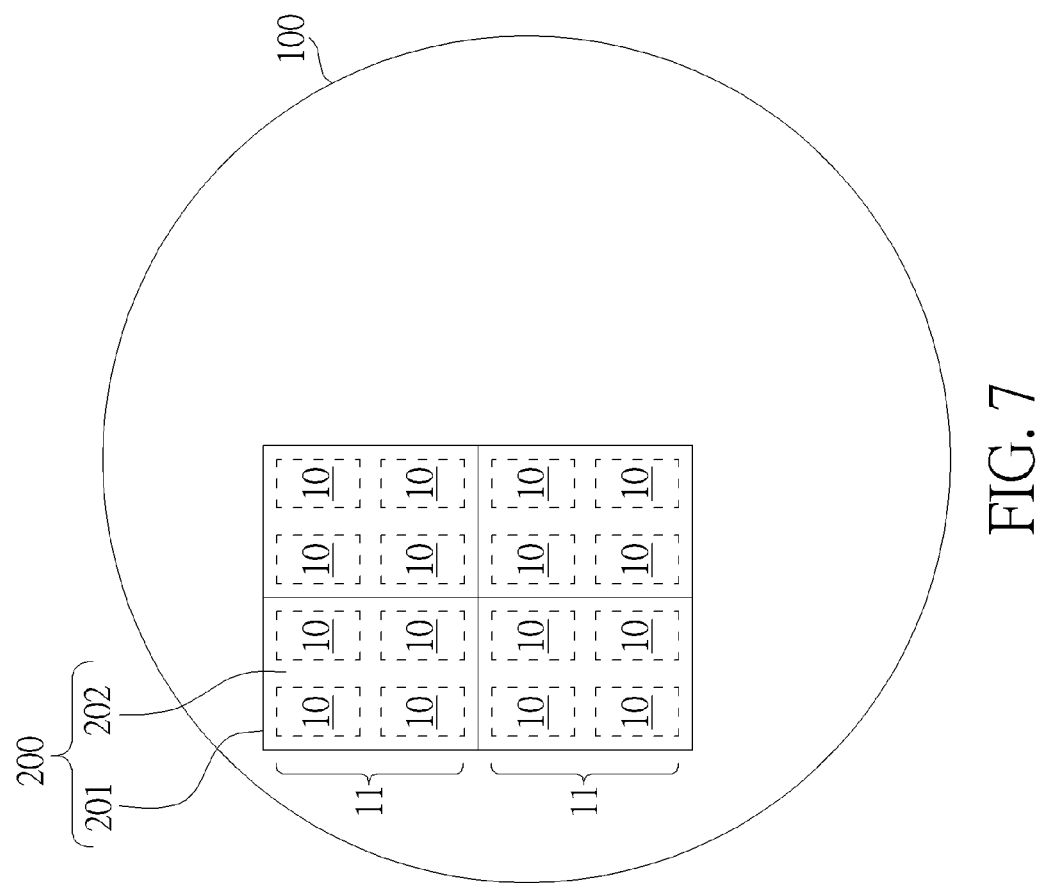
FIG. 7 is a plan view of the wafer schematically showing an exemplary 2×2 chip array and the first and second kerf regions according to one embodiment of the invention.

According to the illustrated embodiment, the chips 10 are diced by sawing the wafer 100 along only the first kerf region 201 to form a multi-chip interposer 11. For example, as shown in FIG. 7, a multi-chip interposer 11 comprising 2×2 chip array is separated by sawing the wafer 100 along the first kerf region 201. It is to be understood that the 2×2 chip array in each multi-chip interposer 11 is for illustration purposes only. Other chip matrix arrangements may be applicable, for example, 3×1 chip array, 3×2 chip array, 2×1 chip array, etc. The second kerf region 202 may also be referred to as a "dummy kerf region".

Still referring to FIG. 1, according to the illustrated embodiment, circuit devices may be located in the second kerf region 202. These circuit devices in the second kerf region 202 are fabricated concurrently with the integrated circuits located in each chip 10 by using the conventional semiconductor processing technologies as mentioned above. The circuit devices may comprise active circuit devices such as MOS devices or transistors, passive circuit devices such as capacitors, resistors, or inductors, or other circuit devices such as fuse circuit or electrostatic discharge (ESD) devices.

According to the illustrated embodiment, a redistribution layer (RDL) 110 is provided on the front side 100*a* of the wafer 100. The RDL 110 may comprise at least a dielectric layer 112, metal traces 114, and bump pads 116 for further connections. It is to be understood that the structure of the RDL 110 depicted in FIG. 1 is for illustration purposes only. It is known that the RDL 110 may have multiple film structures depending upon the design requirements.

Figure 2:
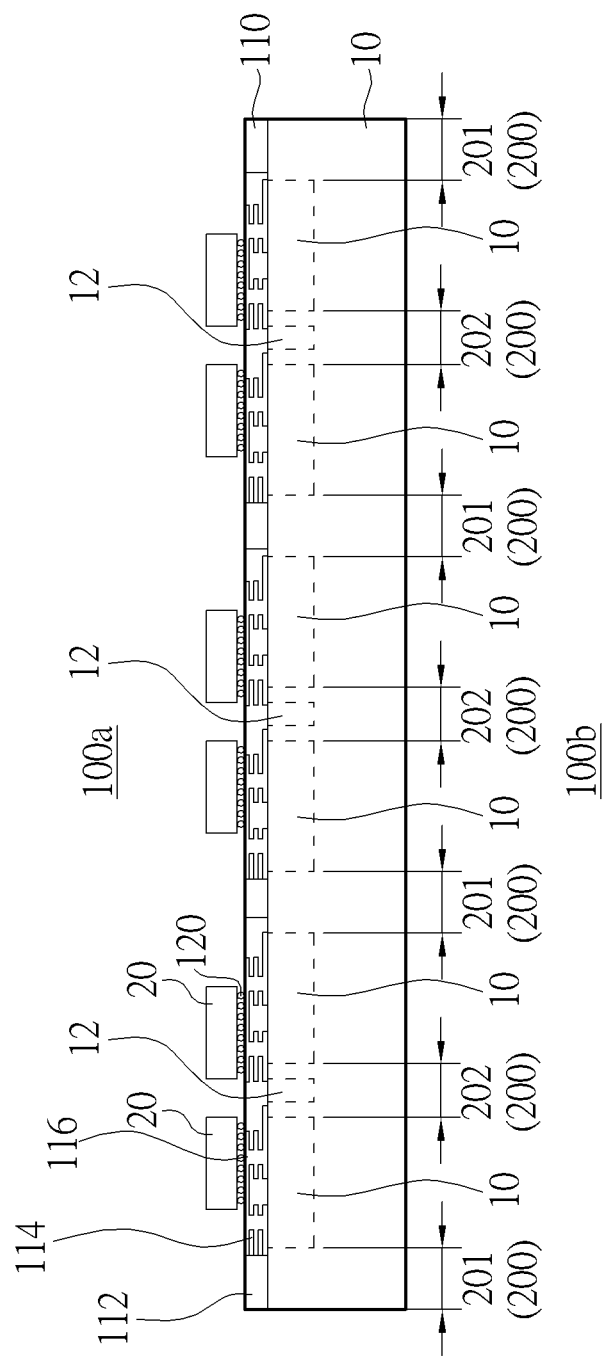

As shown in FIG. 2, subsequently, micro-bumps 120 may be formed on the RDL 110 and semiconductor dies 20 may be optionally mounted onto the RDL 110. According to the illustrated embodiment, the semiconductor dies 20 may be electrically connected to the RDL 110 through the micro-bumps 120. It is to be understood that the number of the semiconductor dies 20 depicted in FIG. 2 is for illustration purposes only. In some embodiments, the semiconductor dies 20 may be skipped.

Figure 3:
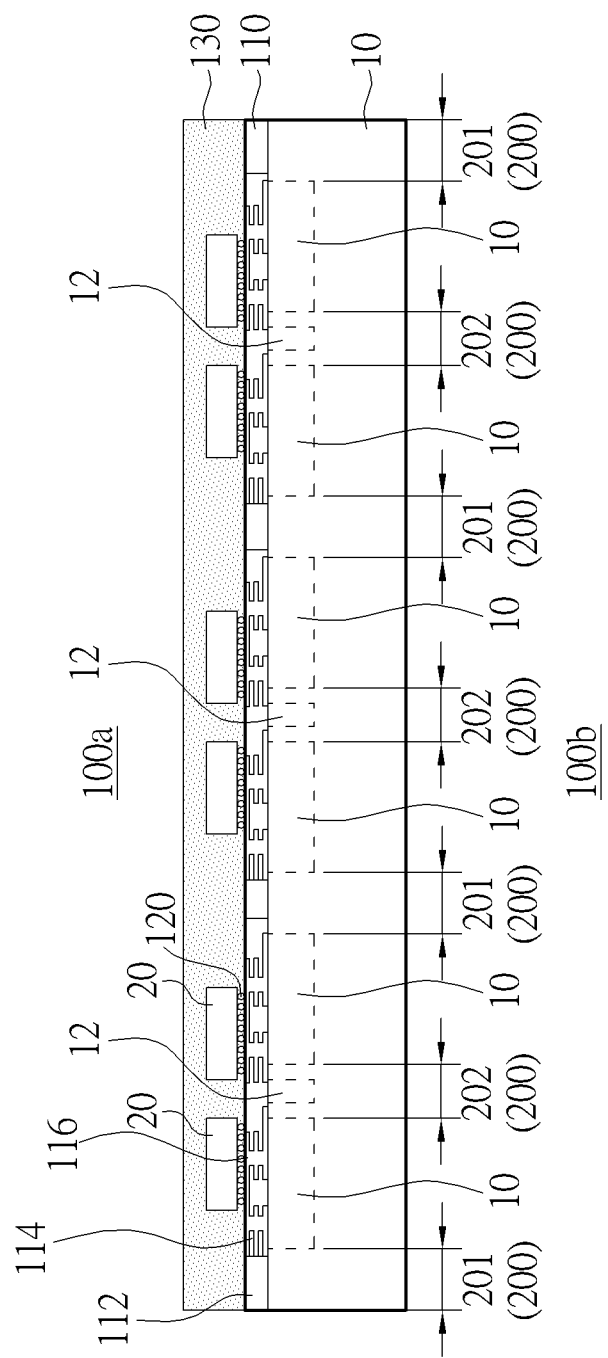

As shown in FIG. 3, subsequently, a mold compound 130 is formed on the front side 100*a* of the wafer. The mold compound 130 covers the attached dies 20 and the top surface of the RDL 110. Preferably, the mold compound 130 completely fills up the gaps between the dies 20. The mold compound 130 may be subjected to a curing process.

According to the illustrated embodiment, the mold compound 130 may be formed using thermoset mold compounds in a transfer mold press, for example. Other means of dispensing the mold compound may be used. Epoxies, resins, and compounds that are liquid at elevated temperature or liquid at ambient temperatures may be used. The mold compound 130 is an electrical insulator, and may be a thermal conductor. Different fillers may be added to enhance the thermal conduction, stiffness or adhesion properties of the mold compound 130.

Figure 4:
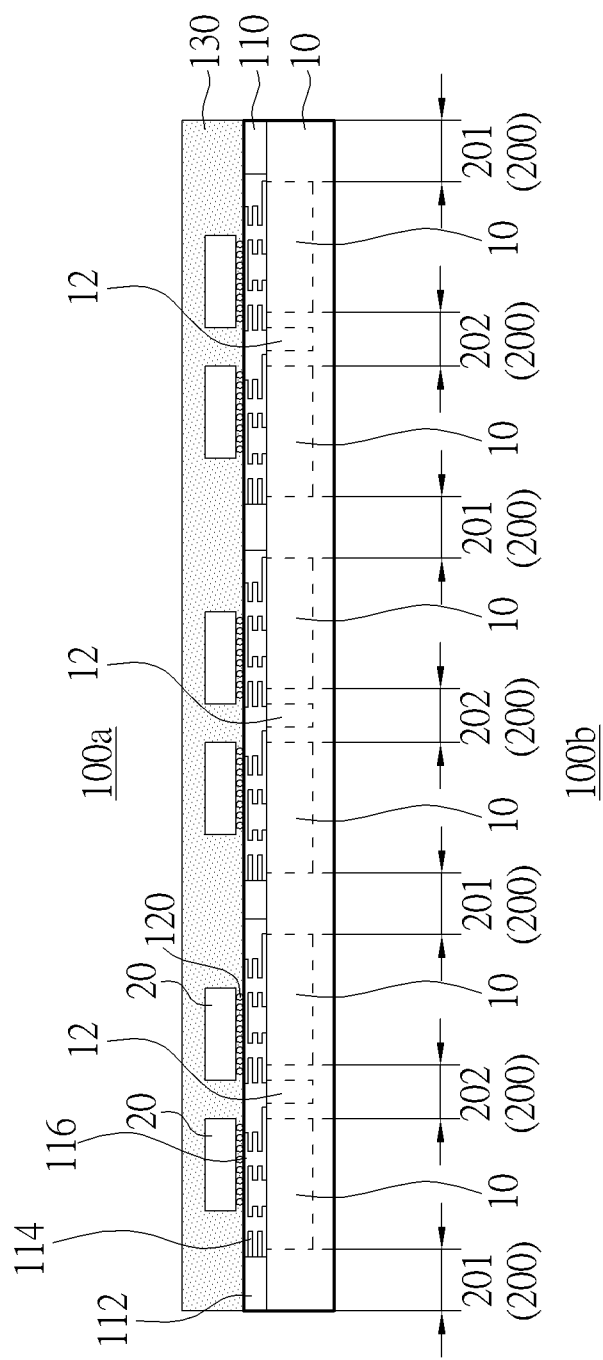

As shown in FIG. 4, after the formation of the mold compound 130, the rear side 100*b* of the wafer 100 is subjected to a wafer back side grinding process in order to remove a portion of the wafer 100 from the rear side 100*b*. For example, the wafer 100 may be first loaded into a wafer grinder (nor shown). Then, a polishing pad is in contact with the rear side 100*b* of the wafer 100 and starts to grind the rear side. The grinding or milling process reduces the thickness of the wafer 100.

Figure 5:
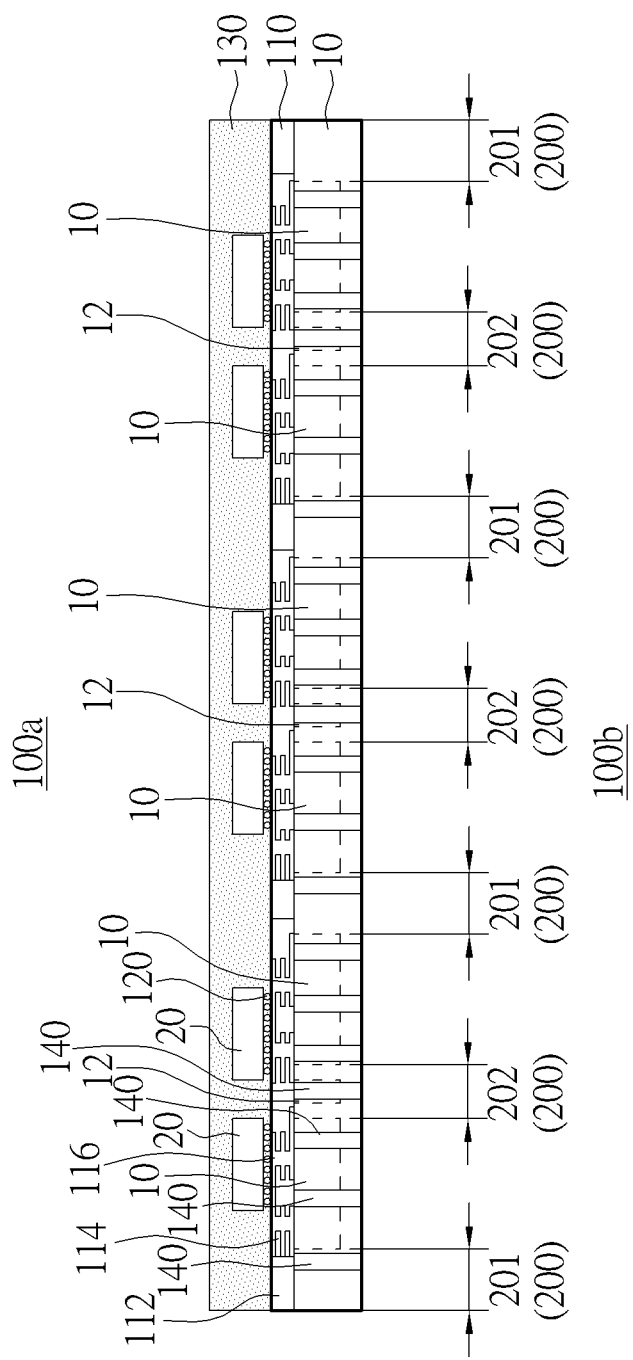

As shown in FIG. 5, subsequently, through-substrate vias (TSVs) 140 are formed in the wafer 100 to electrically connect the RDL 110. To form the TSVs 140, for example, a TSV holes are etched into the wafer 100 from the rear side 100*b* at pre-selected connection points. Then, barrier diffusion layers and conductive layers may be deposited into the TSV holes. A wafer back side polishing or chemical mechanical polishing (CMP) may be performed to removed excess metal layers outside the TSV holes from the rear side 100*b*.

Figure 6:
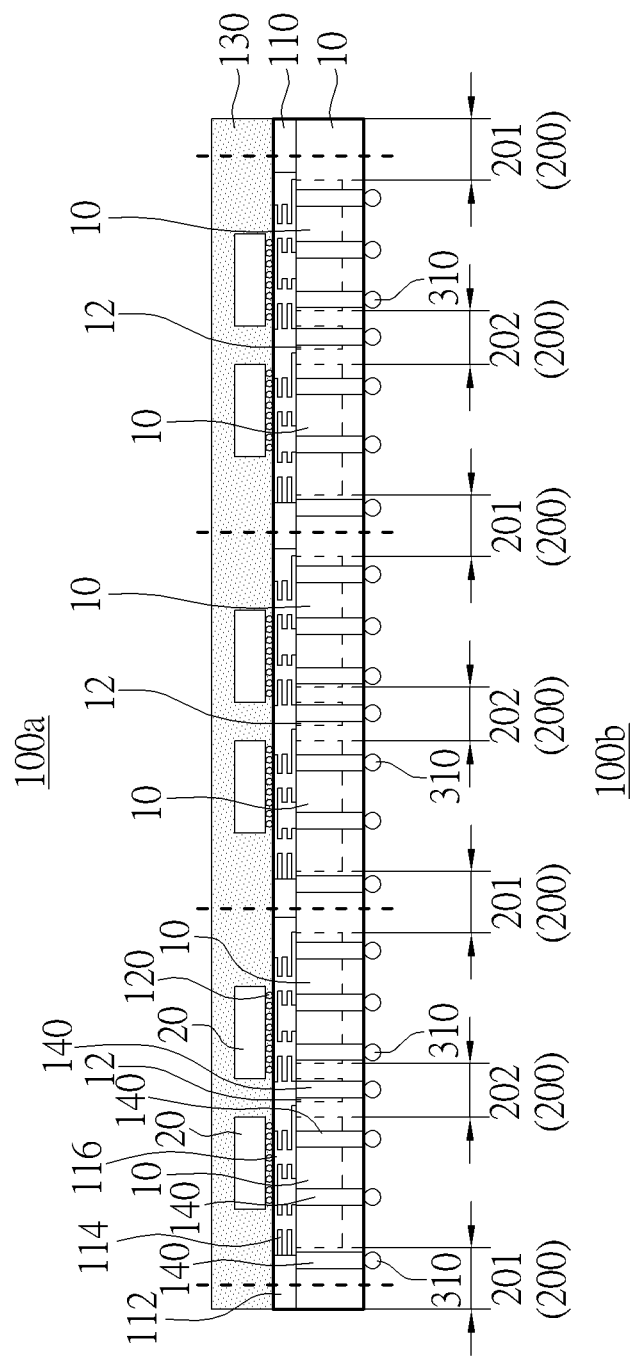

As shown in FIG. 6, solder bumps 310 or the like may be formed on the rear side 100*b* of the wafer 100 to electrically connect the respective TSVs 140. The wafer 100 is then diced to form multi-chip interposers 11 along the first kerf region 201 as set forth in FIG. 7.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A silicon interposer, comprising:
   a silicon substrate having a front side and a rear side opposite to the front side;
   a first integrated circuit chip disposed in the front side of the silicon substrate, wherein the first integrated circuit chip comprises a first memory array;
   a second integrated circuit chip disposed in the front side of the silicon substrate and being in close proximity to the first integrated circuit chip, wherein the second integrated circuit chip comprises a second memory array;
   a dummy kerf region between the first integrated circuit chip and the second integrated circuit chip; and
   at least a circuit device disposed in the front side of the silicon substrate within the kerf region.

2. The silicon interposer according to claim 1, wherein the dummy kerf region separates the first integrated circuit chip from the second integrated circuit chip.

3. The silicon interposer according to claim 1, wherein the circuit device comprises a MOS, a transistor, a capacitor, a resistor, an inductor, a fuse circuit, or an electrostatic discharge (ESD) device.

4. The silicon interposer according to claim 1 further comprising a redistribution layer (RDL) on the front side and wherein the RDL covers the first integrated circuit chip, the second integrated circuit chip, and the dummy kerf region.

5. The silicon interposer according to claim 4, wherein the RDL comprises at least a dielectric layer, metal traces, and bump pads for further connections.

6. The silicon interposer according to claim 4 further comprising through-substrate vias (TSVs) in the silicon substrate to electrically connect the RDL.

7. The silicon interposer according to claim 4 further comprising at least a semiconductor die mounted on the RDL, wherein the RDL is disposed between the semiconductor die and the first integrated circuit chip.

8. The silicon interposer according to claim 7, wherein the semiconductor die is electrically connected to the RDL through micro-bumps.

9. The silicon interposer according to claim 7 further comprising a mold compound on the front side, wherein the mold compound covers the semiconductor die and top surface of the RDL, wherein the mold compound is in direct contact with the semiconductor die.

* * * * *